US012568600B2

(12) United States Patent
Jenkins et al.

(10) Patent No.: US 12,568,600 B2
(45) Date of Patent: Mar. 3, 2026

(54) RACK SYSTEMS, COMPONENTS AND METHODS

(71) Applicant: Newton Instrument Company, Butner, NC (US)

(72) Inventors: Steven Michael Jenkins, Raleigh, NC (US); Robert Louis Hyde, II, Youngsville, NC (US); William Philip Unger, Jr., Butner, NC (US)

(73) Assignee: Newton Instrument Company, Butner, NC (US)

( * ) Notice: Subject to any disclaimer, the term of this patent is extended or adjusted under 35 U.S.C. 154(b) by 40 days.

(21) Appl. No.: 18/237,528

(22) Filed: Aug. 24, 2023

(65) Prior Publication Data

US 2024/0074087 A1      Feb. 29, 2024

Related U.S. Application Data

(60) Provisional application No. 63/400,553, filed on Aug. 24, 2022.

(51) Int. Cl.
| | |
|---|---|
| *F16B 9/00* | (2006.01) |
| *E04H 12/22* | (2006.01) |
| *H05K 7/18* | (2006.01) |

(52) U.S. Cl.
CPC ............. *H05K 7/186* (2013.01); *H05K 7/183* (2013.01); *E04H 12/2269* (2013.01); *F16B 9/05* (2018.08); *F16B 9/052* (2018.08)

(58) Field of Classification Search
CPC .... Y10T 403/70; Y10T 403/7045; F16B 9/05; F16B 9/052; E04H 12/2269

USPC ........... 248/500, 506, 346.01, 346.03, 346.3, 248/346.4, 346.5, 220.21, 220.22, 223.41, 248/224.51, 224.61, 224.8, 223.21, 2, 248/25.11; 52/298, 708
See application file for complete search history.

(56) References Cited

U.S. PATENT DOCUMENTS

| | | | | |
|---|---|---|---|---|
| 4,569,664 | A | * | 2/1986 | Giampetruzzi ...... A63H 33/008 446/110 |
| 5,351,453 | A | * | 10/1994 | Leslie ................... E04H 1/1205 52/270 |
| 2006/0174580 | A1 | * | 8/2006 | Quertelet .............. E04B 1/2403 52/698 |
| 2011/0229258 | A1 | * | 9/2011 | Hirota ...................... H05K 5/13 403/364 |
| 2013/0334389 | A1 | * | 12/2013 | Hill ........................ F16M 13/00 248/346.01 |

* cited by examiner

*Primary Examiner* — Alfred J Wujciak
(74) *Attorney, Agent, or Firm* — KDW Firm PLLC

(57) ABSTRACT

A seismic base for an equipment rack includes a base plate, a first side wall attached to the base plate, a second side wall attached to the base plate, the second side wall being positioned behind the first side wall in a longitudinal direction, an anti-tip support bar extending between the first and second side walls in the longitudinal direction, and a support beam extending in a lateral direction, between the anti-tip support bar and a first lateral wall of the first and second side walls, respectively. The seismic base resists translatory and/or pivoting movements (e.g., of the equipment rack to which the seismic base is attached) in or about, respectively, the longitudinal direction and the lateral direction.

9 Claims, 14 Drawing Sheets

RACK SYSTEMS, COMPONENTS AND METHODS

CROSS-REFERENCE TO RELATED APPLICATION

This application claims priority to U.S. Provisional Patent Application No. 63/400,553, filed on Aug. 24, 2022, the entire content of which is incorporated by reference herein.

BACKGROUND

Telecommunications providers typically use two-post equipment racks to configure and hold the telecommunications infrastructure equipment (e.g., servers, routers, switches, and the like) in place during use. These two-post equipment racks are seismically-rated or non-seismically rated depending on the location where the telecommunications infrastructure equipment is installed, based on the likelihood of seismic activity in such a location. Thus, in California, for example, telecommunications regulations generally require the use of seismically-rated equipment racks unlike, for example, in Florida, in which non-seismically-rated equipment racks are generally allowed to be used due to the considerably lower likelihood of any seismic activity of concern (e.g., of sufficient magnitude to damage a non-seismically-rated equipment rack). The seismic ratings, or magnitude of seismic vibrations, that a telecommunications equipment rack must be able to withstand is regulated in the United States and in other countries in an effort to ensure that there is no widespread outage of telecommunications capability during and/or after a seismic event (e.g., earthquake). In order to render it easier to deploy and configure telecommunications infrastructure equipment, it is common for many telecommunications companies to use only seismically-rated equipment racks, so that deployment and installation of telecommunications infrastructure equipment can be standardized for all installation locations.

The seismic benchmark to which telecommunication equipment racks are tested is Telcordia GR-63-CORE. Zone 4 testing requirements are the most severe and this is normally the standard that is required by most telecommunications operators when qualifying a telecommunications equipment rack for deployment and installation. Typically, such telecommunications equipment racks are constructed of sheet steel and must meet certain spatial requirements set forth in the relevant section(s) of GR-63-CORE, such as footprint, upright depth, and overall dimensions. The weldment is the bare rack without any cosmetic attachments, such as covers or equipment guards. Such weldments are usually about 10" deep, 84" high, and 22" or 26" wide, depending on the width of the equipment to be installed therein. The rack in this state resembles an "L" shape, the base being 10" deep and the upright (at the rear of the base) being 5" deep.

When performing seismic qualification testing on such telecommunications equipment racks, weight plates are typically attached the entire height of the rack to simulate the attachment of equipment along the height of the rack. For the aforementioned telecommunications equipment racks made of sheet steel, seismic load ratings are generally in the range of between about 350 pounds (lbs.) to about 500 lbs. (including a mandatory 50 lb. mounted to the top of the rack to simulate overhead cable load), meaning that, if the seismic qualification testing of the telecommunications equipment rack is successful, such telecommunication equipment racks will be deemed to satisfy all seismic test criteria and will pass with that simulated load. Recent advances in electronics miniaturization, however, are placing increasing requirements on telecommunications equipment rack payloads and the demand for stronger racks is increasing accordingly. Thus, a need exists at present for telecommunications equipment racks that can meet these increasing requirements to meet commercial demand for such products.

SUMMARY

According to a first example embodiment, a base structure is provided for an equipment rack, the base structure comprising a base plate; a first side wall attached to the base plate; a second side wall attached to the base plate, the second side wall being positioned behind the first side wall in a longitudinal direction; an anti-tip support bar extending between the first and second side walls in the longitudinal direction; and a support beam extending in a lateral direction, between the anti-tip support bar and a first lateral wall of the first and second side walls, respectively. The base structure is configured to resist translatory and/or pivoting movements in or about, respectively, the longitudinal direction and the lateral direction.

In some embodiments of the base structure, the first and second side walls are substantially identical mirror images of each other; and/or the anti-tip support bar and the first and second side walls, when assembled together, form a channel configured to receive therein an upright of the equipment rack.

In some embodiments of the base structure, the channel has a U-shaped cross-sectional profile and extends coplanar with a bottom surface of the base plate or a top surface of the base plate.

In some embodiments of the base structure, the U-shaped cross-sectional profile is formed by an upright wall segment of each of the first and second side walls and the anti-tip support bar.

In some embodiments of the base structure, the anti-tip support bar is welded, at opposing ends thereof in the longitudinal direction, to the first side wall and to the second side wall, respectively.

In some embodiments of the base structure, the support beam is configured to engage with the anti-tip support bar to resist movement of the upright within the channel in the lateral direction.

In some embodiments of the base structure, the base plate comprises a plurality of assembly notches and/or assembly slots formed therein in a thickness direction of the base plate; the first and second side walls each comprise a plurality of assembly tabs positioned to align with the plurality of the assembly notches of the base plate for assembly of the first and second side walls to the base plate; the anti-tip support bar comprises an assembly notch formed on an upper surface thereof and a plurality of assembly tabs formed on a bottom surface thereof; and the support beam comprises an assembly tab configured for insertion within the assembly notch of the anti-tip support bar.

In some embodiments of the base structure, the assembly tabs and assembly notches and assembly slots are formed such that the base structure can be assembled without the use of a jig to hold the base plate, the first and second side walls, the anti-tip support bar, and the support beam together prior to a welding process being performed to form the base structure.

In some embodiments of the base structure, the base plate is welded to each of the first and second side walls, the anti-tip support bar, and the support beam; the anti-tip support bar is welded to the first and second side walls and the support beam; and the first and second side walls are welded to the support beam.

According to another example embodiment, an equipment rack is disclosed herein, the equipment rack comprising a plurality of the base structures according to any of the example embodiments disclosed herein, a plurality of uprights, each upright being rigidly attached to one of the plurality of base structures at a lower end of the upright; a lower spanner that is rigidly connected to and spanning between the plurality of base structures; and an upper spanner that is rigidly connected to and spanning between the plurality of uprights at an upper end of each of the plurality of uprights.

According to another example embodiment, a method of forming a base structure of an equipment rack is provided herein, the method comprising: providing a base plate; positioning an anti-tip support bar on the base plate; attaching a first side wall to the base plate; attaching a second side wall to the base plate, the second side wall being positioned behind the first side wall in a longitudinal direction; and positioning a support beam to extend in a lateral direction, between the anti-tip support bar and a first lateral wall of the first and second side walls, respectively. According to this method, the base structure resists translatory and/or pivoting movements in or about, respectively, the longitudinal direction and the lateral direction; and the anti-tip support bar extends between the first and second side walls in the longitudinal direction.

In some embodiments of the method, the two side walls are substantially identical mirror images of each other; and/or the anti-tip support bar and the first and second side walls form, when assembled together, a channel into which an upright of the equipment rack can be inserted therein.

In some embodiments of the method, the channel has a U-shaped cross-sectional profile and extends coplanar with a bottom surface of the base plate or a top surface of the base plate.

In some embodiments of the method, the U-shaped cross-sectional profile is formed by an upright wall segment of each of the first and second side walls and the anti-tip support bar.

In some embodiments of the method, the anti-tip support bar comprises, at each end thereof, a vertical section, with a void extending between the vertical sections of the anti-tip support bar; for the upright wall segment of each of the first and second side walls, a protrusion extends therefrom, such that each of the protrusions extends into the void and against one of the vertical sections; and engagement of the protrusions with the upright wall segment of the first or second side wall provides support to the upright wall segment to resist movement of the upright within the channel in the longitudinal direction.

In some embodiments of the method, the support beam engages with the anti-tip support bar to resist movement of the upright within the channel in the lateral direction.

In some embodiments of the method, the base plate comprises a plurality of assembly notches and/or assembly slots formed therein in a thickness direction of the base plate; the first and second side walls each comprise a plurality of assembly tabs positioned so as to align with the plurality of the assembly notches of the base plate for assembly of the first and second side walls to the base plate; the anti-tip support bar comprises an assembly notch formed on an upper surface thereof and a plurality of assembly tabs formed on a bottom surface thereof; and the support beam comprises an assembly tab that is insertable within the assembly notch of the anti-tip support bar.

In some embodiments of the method, the assembly tabs and assembly notches and assembly slots are formed such that the base structure can be assembled without the use of a jig to hold the base plate, the first and second side walls, the anti-tip support bar, and the support beam together prior to a welding process being performed to form the base structure.

In some embodiments, the method comprises welding the base plate to each of the first and second side walls, the anti-tip support bar, and the support beam; welding the anti-tip support bar to the first and second side walls, and the support beam; and welding the first and second side walls to the support beam.

According to another example embodiment, a method of forming an equipment rack is provided herein, the method comprising forming a plurality of base structures, comprising steps of providing a base plate; positioning an anti-tip support bar on the base plate; attaching a first side wall to the base plate; attaching a second side wall to the base plate, the second side wall being positioned behind the first side wall in a longitudinal direction; and positioning a support beam to extend in a lateral direction, between the anti-tip support bar and a first lateral wall of the first and second side walls, respectively; wherein the base structure resists translatory and/or pivoting movements in or about, respectively, the longitudinal direction and the lateral direction; and wherein the anti-tip support bar extends between the first and second side walls in the longitudinal direction. This method further comprises rigidly attaching an upright to each of the plurality of base structures at a lower end of the upright, such that the equipment rack comprises a plurality of the uprights; rigidly connecting a lower spanner to the plurality of base structures, wherein the lower spanner spans between the plurality of base structures; and rigidly connecting an upper spanner to the plurality of uprights at an upper end of each of the plurality of uprights, wherein the upper spanner spans between the plurality of uprights at the upper end of each of the plurality of uprights.

DETAILED DESCRIPTION

Figure 1:
FIG. 1 is an exploded view of a seismic base for use in securing a telecommunications equipment rack to prevent structural failure thereof during a seismic event.

The terminology used herein is for the purpose of describing particular example embodiments only and is not intended to be limiting of the presently disclosed subject matter.

While the following terms are believed to be well understood by one of ordinary skill in the art, the following definitions are set forth to facilitate explanation of the presently disclosed subject matter.

All technical and scientific terms used herein, unless otherwise defined below, are intended to have the same meaning as commonly understood by one of ordinary skill in the art. References to techniques employed herein are intended to refer to the techniques as commonly understood in the art, including variations on those techniques or substitutions of equivalent techniques that would be apparent to one skilled in the art. While the following terms are believed to be well understood by one of ordinary skill in the art, the following definitions are set forth to facilitate explanation of the presently disclosed subject matter.

In describing the presently disclosed subject matter, it will be understood that a number of features are disclosed. Each of these has individual benefit and each can also be used in conjunction with one or more, or in some cases all, of the other disclosed features.

Accordingly, for the sake of clarity, this description will refrain from repeating every possible combination of the individual features in an unnecessary fashion. Nevertheless, the specification and claims should be read with the understanding that combinations of features from different example embodiments are entirely within the scope of the invention and the claims. Thus, features of different example embodiments can be combined without limitation to form further example embodiments that, while perhaps not shown in the figures in such a specific combination, are nevertheless within the scope of the presently disclosed subject matter.

Following long-standing patent law convention, the terms "a", "an", and "the" refer to "one or more" when used in this application, including the claims. Thus, for example, reference to "a cap" includes a plurality of such caps, and so forth.

Unless otherwise indicated, all numbers expressing quantities of ingredients, reaction conditions, and so forth used in the specification and claims are to be understood as being modified in all instances by the term "about". Accordingly, unless indicated to the contrary, the numerical parameters set forth in this specification and attached claims are approximations that can vary depending upon the desired properties sought to be obtained by the presently disclosed subject matter.

As used herein, the term "about," when referring to a value or to an amount of a composition, mass, weight, temperature, time, volume, dimension, concentration, percentage, etc., is meant to encompass variations of in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed methods or employ the disclosed compositions.

The term "comprising", which is synonymous with "including" "containing" or "characterized by" is inclusive or open-ended and does not exclude additional, unrecited elements or method steps. "Comprising" is a term of art used in claim language which means that the named elements are essential, but other elements can be added and still form a construct within the scope of the claim.

As used herein, the phrase "consisting of" excludes any element, step, or ingredient not specified in the claim. When the phrase "consists of" appears in a clause of the body of a claim, rather than immediately following the preamble, it limits only the element set forth in that clause; other elements are not excluded from the claim as a whole.

As used herein, the phrase "consisting essentially of" limits the scope of a claim to the specified materials or steps, plus those that do not materially affect the basic and novel characteristic(s) of the claimed subject matter.

With respect to the terms "comprising", "consisting of", and "consisting essentially of", where one of these three terms is used herein, the presently disclosed and claimed subject matter can include the use of either of the other two terms.

As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

The subject matter disclosed herein addresses problems encountered from the use of presently known seismically-rated telecommunications equipment racks in seismically-active regions with increased weight or mass bearing capacities. Because such telecommunications equipment racks are typically only connected to the floor (e.g., by a threaded connection, such as bolts), during a seismic event, any forward and backwards swaying of the telecommunications equipment rack, the mass of the equipment installed in the rack will act as a rotational moment in the direction of sway, which must be resisted by the telecommunications equipment rack in order to avoid falling or collapsing in the direction of sway. The recent advances in electronics miniaturization that has increased the structural rigidity requirements of such telecommunications equipment racks is thus solved by the use of the seismic base, or foot, disclosed herein for use in such telecommunications equipment racks.

Figure 6:
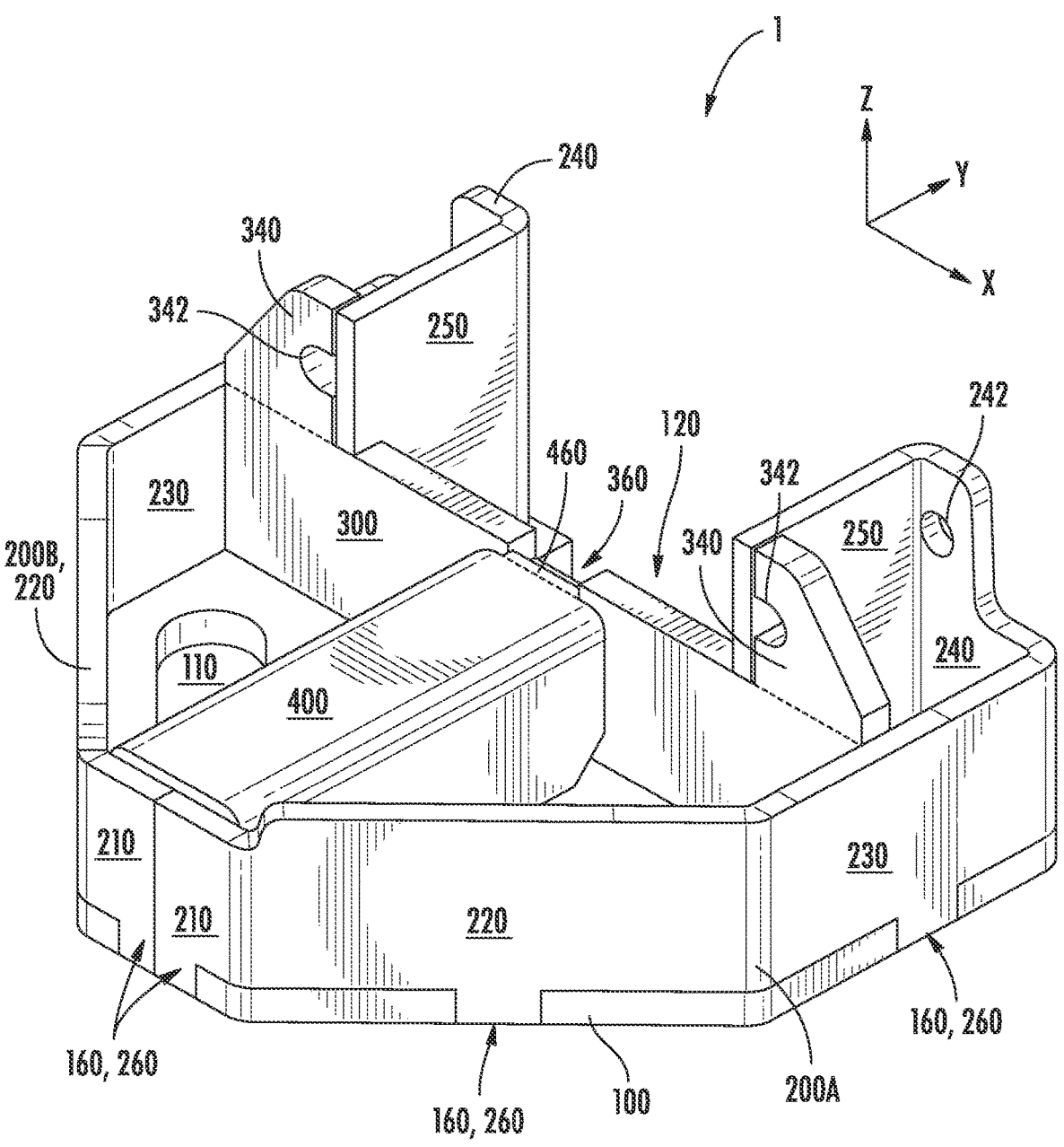
FIG. 6 is an isometric view of the seismic base shown in FIG. 5 in a fully assembled state.
Figure 7:
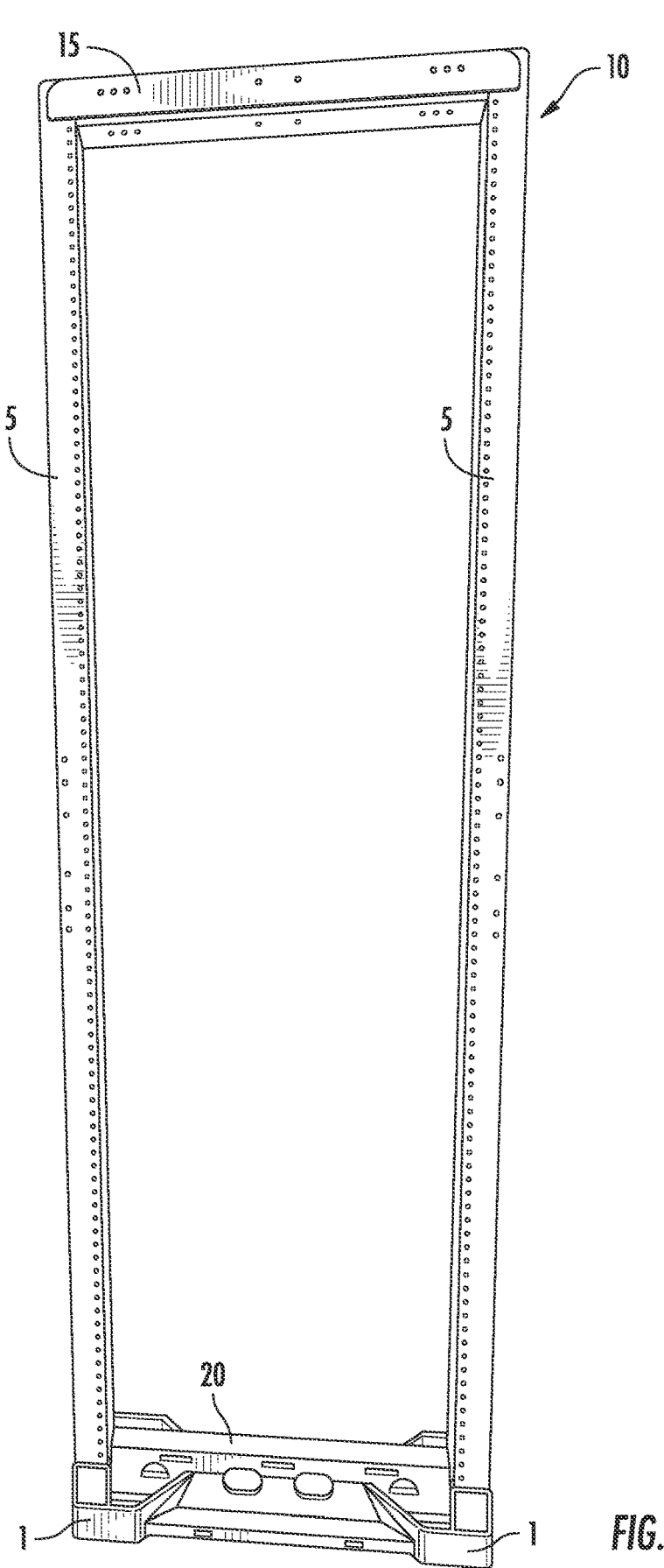
FIGS. 7 and 8 are perspective generally frontal views of an example embodiment of a rack having two of the example seismic bases shown in FIGS. 1-6.
Figure 8:
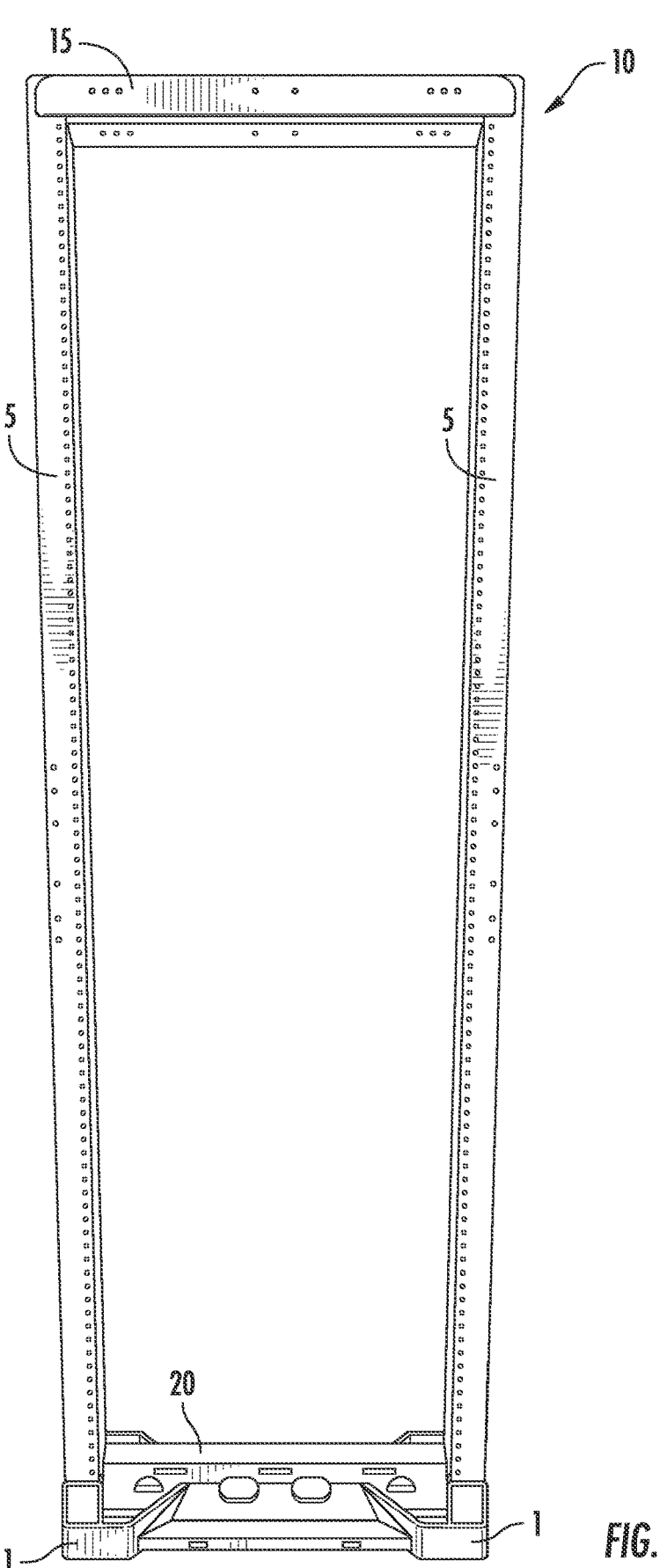
Figure 9:
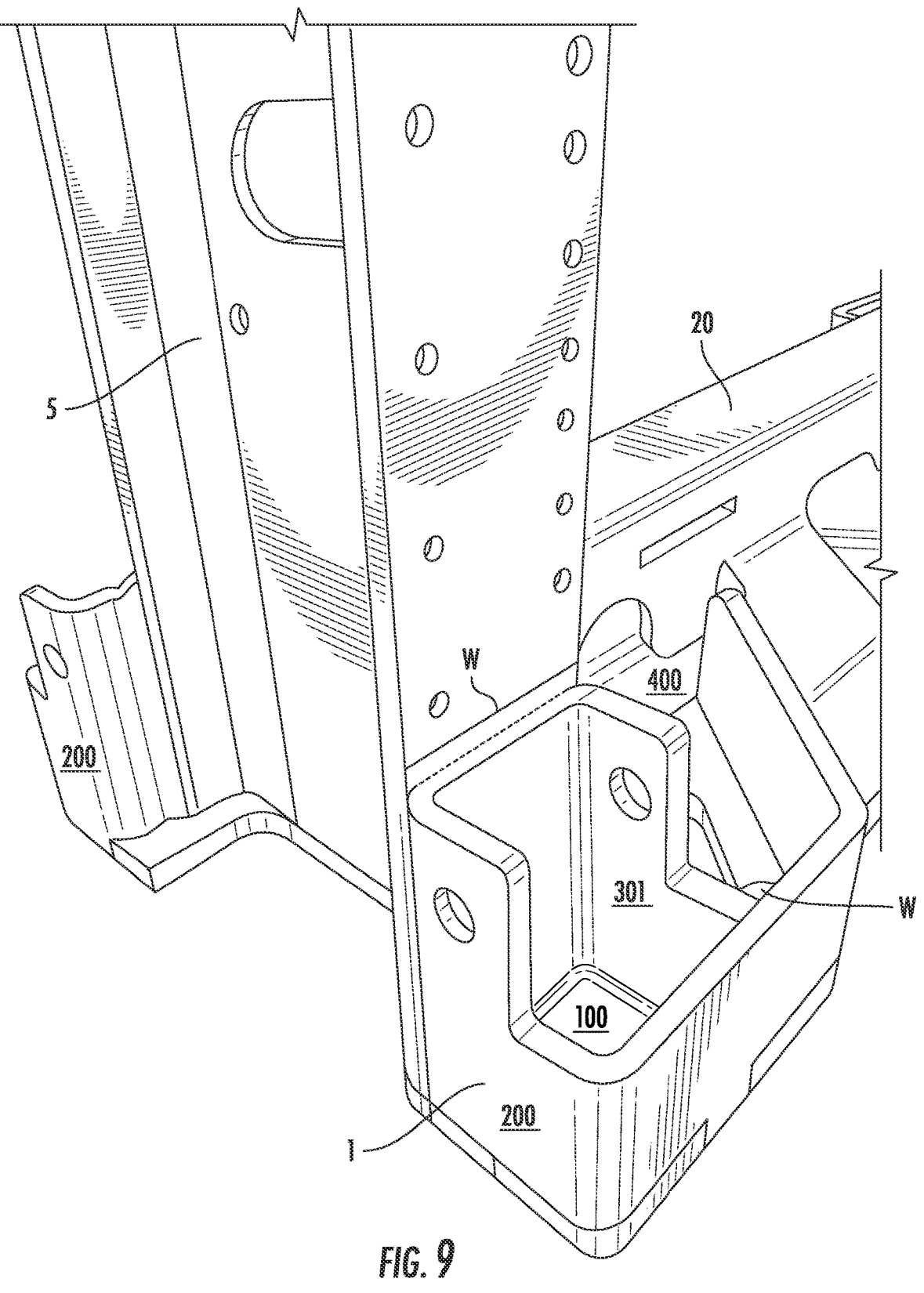
FIG. 9 is an isometric perspective view of a portion of the rack shown in FIGS. 7 and 8, focusing particularly on one of the seismic bases thereof.
Figure 10:
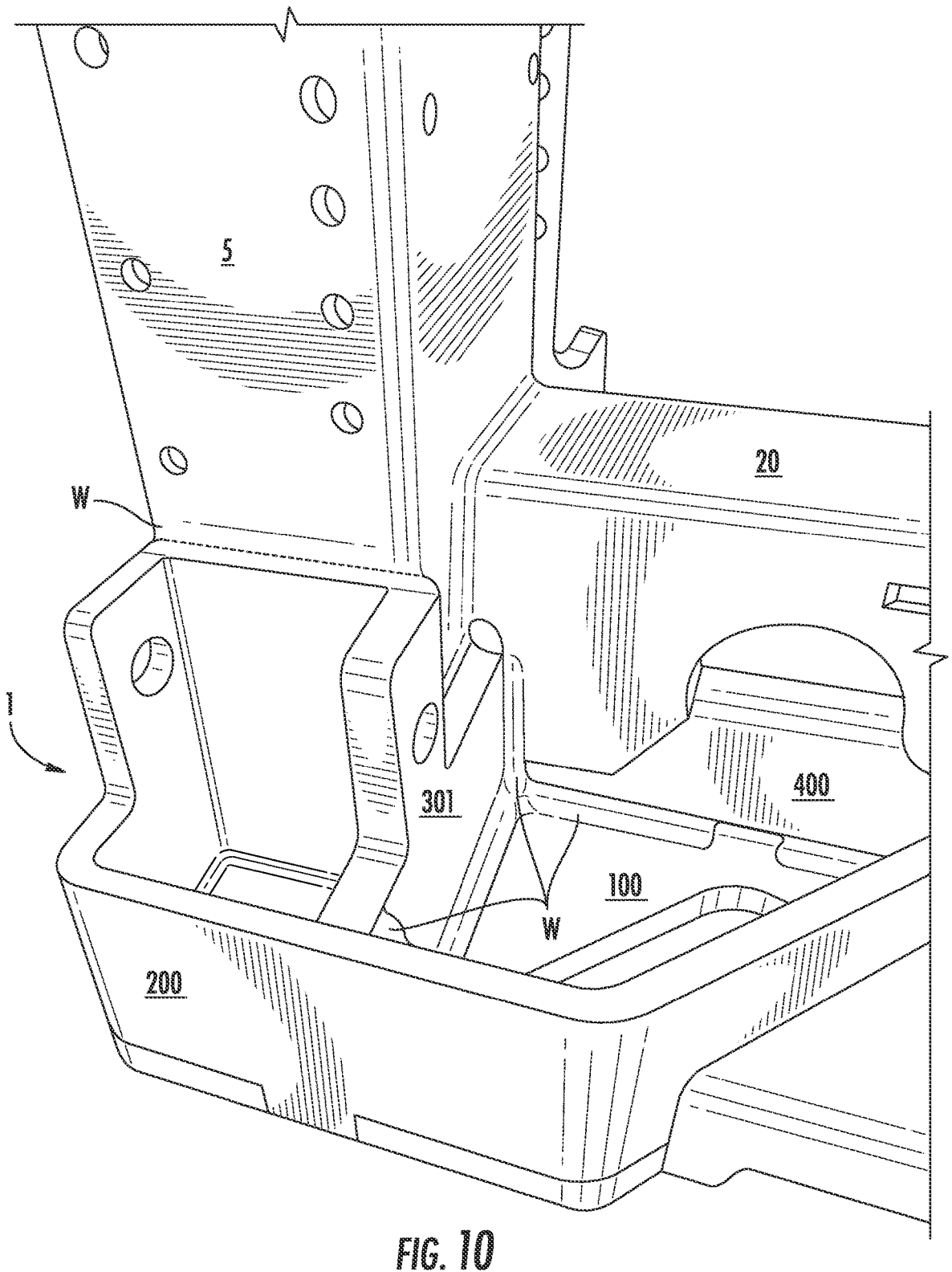
FIG. 10 is a perspective view of the portion of the rack shown in FIG. 9.

The subject matter disclosed herein relates to a seismic base, generally designated 1, or foot, for rigid attachment to a substructure (e.g., floor) on a first side of the seismic base 1 and that provides or defines a channel, generally designated 120 (see, e.g., FIGS. 11A and 12), into which a rack upright member, or beam, generally designated 5 (see, e.g., FIGS. 2 and 7-10), can be rigidly inserted to form a portion of a telecommunications equipment rack, generally designated 10 (see, e.g., FIGS. 7 and 8). Aspects of a first example embodiment of such a seismic base 1 are described herein and, furthermore, are illustrated in FIGS. 1-6.

The individual components from which the seismic base 1 is assembled are shown in the exploded view of FIG. 1. The seismic base 1 can also be referred to herein as a base structure and is configured for use in providing an anchor point for securing one side, or half, of a telecommunications equipment rack to a substantially rigid substrate, such as a floor (e.g., which can be formed as a concrete, or cement, slab, or any other suitably rigid structure). As shown in FIG.

1, the seismic base 1 comprises a base plate 100, at least two side walls, generally designated 200A, 200B, respectively, an anti-tip support bar 300, and a support beam 400.

The base plate 100 advantageously comprises, formed around the perimeter of the base plate 100, a plurality of assembly notches, generally designated 160. Each of the side walls 200A, 200B comprises a plurality of assembly tabs, generally designated 260, each assembly tab 260 being provided on a lower edge of the side wall 200A, 200B to which such assembly tab 260 is attached. The assembly tabs 260 on each of the side walls 260 are formed in a location on the lower edge of the corresponding side wall 200A, 200B in a location that corresponds to one of the plurality of assembly notches 160 formed in the base plate 100, such that each of the assembly tabs 260 of each side wall 200A, 200B is insertable within one of the assembly notches 160 formed in the base plate 100 when such side wall 200A, 200B is connected to the base plate. Stated somewhat differently, each of the assembly tabs 260 on each of the side walls 200A, 200B are spaced apart from each other and arranged in a pattern that corresponds to the same pattern by which a portion of the assembly notches 160 are arranged about the perimeter of the base plate 100, such that each assembly tab 260 is, when such side wall 200A, 200B is assembled on, or attached to, the base plate 100, vertically aligned with one of the assembly notches 160 of the base plate 100, such that each assembly tab 260 can be engaged within one of the assembly notches 160 in a sequential, staggered, or simultaneous manner.

Figure 2:
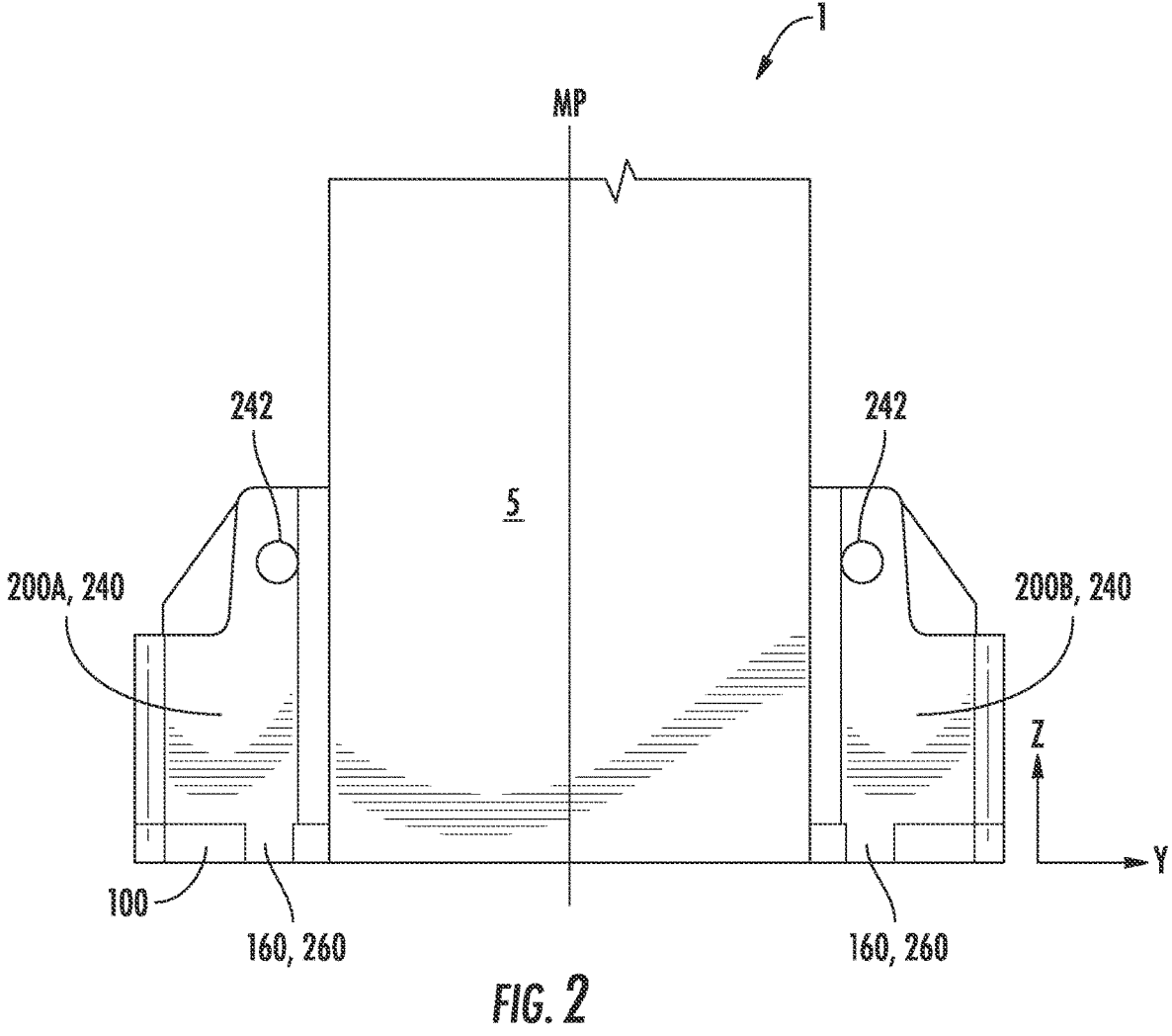
FIG. 2 is a side view of the seismic base shown in FIG. 1.

Each side wall 200A, 200B is shaped to have a profile or shape (e.g., when viewed in the vertical direction, which is defined as the vertical direction of the drawing sheet in at least FIGS. 1 and 2; see also, Z in FIGS. 1 and 2) that is the same, or at least is substantially similar (e.g., allowing for tolerances that may occur during manufacturing) to, the outer edge of a portion of the perimeter of the base plate 100 where the assembly tabs 260 of such side wall 200A, 200B are designed to engage within the corresponding assembly notches 160 of the base plate 100. In some embodiments, the side wall 200A, 200B has the same profile, or shape, along the entire length thereof as the portion of the perimeter of the base plate 100 to which such side wall 200A, 200B is to be attached, such that no portion of the side wall 200A, 200B extends beyond the perimeter of the base plate 100. As used herein the term "perimeter" of the base plate 100 is used to refer to an outermost boundary of the base plate 100, excluding the assembly notches 160 (e.g., as if such assembly notches 160 were not present, such that the edges of the base plate 100 on opposite sides of each of the assembly notches 160 would be regarded as extending through and filling such assembly notch 160). The assembly notches 160 can, in some embodiments, be formed through only a portion of a thickness, or through an entire thickness, of the base plate 100. The assembly tabs 260 thus extend from a bottom surface, or edge, of such side wall 200A, 200B and into a corresponding assembly notch 160 formed in the base plate 100.

The distance by which the assembly tabs 260 of the side walls 200A, 200B extend away from the bottom surface of such side wall 200A, 200B is substantially the same as, or less than, a depth (e.g., in the thickness direction of the base plate 100) of the corresponding assembly notch 160 of the base plate 100 into which such assembly tab 260 is designed, designated, and/or configured for insertion. The assembly notches 160 and assembly tabs 260 are advantageously arranged on the base plate 100 and one of the side walls 200A, 200B, respectively, such that there is at least one assembly notch 160 and assembly tab 260, respectively, on opposite, or non-adjacent or non-contiguous, sides of the base plate 100 and the side wall 200A, 200B, such that such side wall 200A, 200B is held in a substantially vertical orientation after all of the assembly tabs 260 of such side wall 200A, 200B are inserted within the corresponding assembly notches 160 of the base plate 100, but before such side wall 200A, 200B is fixedly attached (e.g., by welding) to the base plate 100.

The base plate 100 also has, formed through an entire thickness thereof, at least one (e.g., a plurality of) fastener holes, generally designated 110, in which fasteners can be positioned for rigidly attaching the seismic base 1 to a substructure (e.g., a floor). In the example embodiments shown herein, the fastener holes 110 are in the shape of elongated slots, specifically having a generally stadium-shaped outline, also referred to as an obround hole or shape. The fastener slot(s) 110 are sized and located on and in the base plate 100 per the spatial requirements set forth in GR-63-CORE such that the fastener slot(s) 110 can be configured for use with a sufficiently robust fastener, such as a seismic expansion anchor, for securing the base plate 100 and, thus necessarily, the seismic base 1 to the substructure into which the fastener(s) extend.

The base plate 100 also has, formed through a portion of, or an entirety of, the thickness of the base plate 100, at least one (e.g., a plurality of) assembly slots, generally designated 170. These assembly slots 170 are shaped to receive assembly tabs 370 that are formed so as to extend from a bottom surface, or edge, of the anti-tip support bar 300 and into a corresponding one of the assembly slots 170. The distance by which the assembly tabs 370 of the anti-tip support bar 300 extend away from the bottom surface thereof is substantially the same as, or less than, a depth (e.g., in the thickness direction) of the assembly slot 170 of the base plate 100 into which such assembly tab 370 is designed, designated, and/or configured for insertion. The assembly slots 170 of the base plate 100 and the assembly tabs 370 of the anti-tip support bar 300 advantageously have a substantially similar cross-sectional area (e.g., when viewed in the vertical direction of FIGS. 1 and 2). As used in this context, "substantially similar" means that, while the assembly tabs 370 are smaller dimensionally in cross-section than the corresponding assembly slots 170, the anti-tip support bar 300 is held in a substantially vertical orientation when all of the assembly tabs 370 of the anti-tip support bar 300 are inserted within a corresponding one of the assembly slots 170 of the base plate 100, but before the anti-tip support bar 300 is fixedly attached (e.g., by welding) to the base plate 100. The anti-tip support bar 300 has a primary direction of extension in the longitudinal direction Y, meaning that the largest dimension of the anti-tip support bar 300 is in the longitudinal direction Y. Thus, the length (i.e., in the longitudinal direction Y) of the anti-tip support bar 300 is greater than the thickness (i.e., in the lateral direction X) and the height (i.e., in the vertical direction Z).

The base plate 100 is generally in the form of a piece of plate steel and is formed (e.g., by cutting, stamping, machining, bending, or any other forming process) with integral assembly slots 170 formed internal to the perimeter of the base plate 100 and integral assembly notches 160 that are formed around the perimeter of the base plate 100, such that the seismic base 1 is self-fixtured (e.g., requiring no assembly jig during assembly) when the base plate 100, the side walls 200A, 200B, the anti-tip support bar 300, and the support beam 400 are being assembled together (e.g., by welding) to form the seismic base 1. In some embodiments, fixtures are used when welding together the base plate 100, the side walls 200A, 200B, the anti-tip support bar 300, and the support beam 400 to form the seismic base 1; the use of fixtures allow for the relative locations of the base plate 100, the side walls 200A, 200B, the anti-tip support bar 300, and the support beam 400 to be precisely maintained during the welding process, which can be performed, for example, using a robotic welding machine. As used herein, the term "integral" can mean a structure that has a unitary, or mono-lithic structure, but it not necessarily limited to such defi-nition and can also include the conventional definition of the word "integral" as well. The base plate 100 is also advan-tageously formed to have a sufficient thickness that the requirement for a reinforcing plate used on most conven-tional telecommunications equipment racks can be omitted, thereby simplifying assembly and reducing cost.

In the example embodiment shown, the side walls 200A, 200B are substantially identical to each other but mirror images of each other, meaning that they are identical about a mirror plane (see, e.g., MP in FIG. 2) extending in the lateral (see, e.g., X in FIGS. 1 and 2) and vertical directions (see, e.g., Z FIGS. 1 and 2) through the midpoint of the base plate 100. The features of the base plate 100 are also symmetrical with respect to this mirror plane MP. Thus, the side wall 200A, 200B comprises, in the example embodi-ment disclosed herein, five (5) wall segments, including a first longitudinal wall segment 210, a diagonal wall segment 220 connected (e.g., directly) to the first longitudinal wall segment 210, a lateral wall segment 230 connected (e.g., directly) to the diagonal wall segment 220, a second longi-tudinal wall segment 240 connected (e.g., directly) to the lateral wall segment 230, and an upright wall segment 250 connected (e.g., directly) to the second longitudinal wall segment 240.

Each of the wall segments (e.g., 210, 220, 230, 240, 250) of the side walls 200A, 200B are substantially planar struc-tures (e.g., except for bending that may occur where adjacent wall segments 210, 220, 230, 240, 250 are adjoined). The first and second longitudinal wall segments 210, 240 are arranged substantially parallel to each other and have a respective assembly tab 260 extending from the bottom surface thereof. The lateral wall segment 240 and the diagonal wall segment 220 are arranged at an angle of between 0° and 90° relative to each other and relative to the first and second longitudinal wall segments 210, 240. In the example embodiment shown, the diagonal wall segment 220 is arranged, at a first end thereof, at about a 45° angle (e.g., +/−5°) relative to the first longitudinal wall segment 210 and, at a second end thereof, at about a 45° angle (e.g., +/−5°) relative to the lateral wall segment 230. The angles between the diagonal wall segment 220 and the first longi-tudinal wall segment 210 and the lateral wall segment 230, respectively, are inversely proportional to each other, such that a sum of these angles is substantially 90° (e.g., +/−5°) in embodiments in which the lateral wall segment 230 is perpendicular to the first longitudinal wall segment 210. In some embodiments, the diagonal wall segment 220 can be omitted entirely, and the lateral wall segment 230 and the first longitudinal wall segment 210 can extend to intersect with each other at a substantially 90° angle (e.g., +/−5°). The second longitudinal wall segment 240 is arranged at a substantially 90° angle (e.g., +/−5°) relative to the lateral wall segment 230 and the upright wall segment 250 is arranged at a substantially 90° angle (e.g., +/−5°) relative to the second longitudinal wall segment 240. An opposite end of the upright wall segment 250 from where the upright wall segment 250 is attached to the second longitudinal wall segment 240 has a protrusion 252 that extends by a distance that is substantially the same as the thickness (e.g., X in FIGS. 1 and 2) of the anti-tip support bar 300, for rigidly connecting (e.g., directly) the upright wall segment 250 to the anti-tip support bar 300.

The side walls 200A, 200B are the same (e.g., identical, so as to be able to be laid directly on top of each other and having the same outline) in their flat state but are formed (e.g., by cutting, stamping, machining, bending, or any other forming process) in opposite ways from each other (e.g., as mirror images of each other) to construct the first and second side walls 200A, 200B. The side walls 200A, 200B each have assembly tabs 260 in the areas of the side walls 200A, 200B that correspond to the respective positions of the assembly notches 160 formed in the perimeter of the base plate 100, which allows the side walls 200A, 200B and the base plate 100 to snap together during assembly of the seismic base 1 and to be held together without the use of any external parts before the welding process begins. In some embodiments, all of the base plate 100, the side walls 200A, 200B, the anti-tip support bar 300, and the support beam 400 can be assembled together and are formed in such a manner that each of these structures is held together without the use of any external parts before the welding process begins. In some embodiments, fixtures are used when welding together the base plate 100, the side walls 200A, 200B, the anti-tip support bar 300, and the support beam 400 to form the seismic base 1; the use of fixtures allow for the relative locations of the base plate 100, the side walls 200A, 200B, the anti-tip support bar 300, and the support beam 400 to be precisely maintained during the welding process, which can be performed, for example, using a robotic welding machine.

The seismic base 1 is formed by providing a base plate 100; attaching the anti-tip support bar 300 to the base plate 100 by inserting each of the assembly tabs 370 of the anti-tip support bar 300 into a corresponding one of the assembly slots 170 of the base plate 100, such that the anti-tip support bar 300 is supported in a substantially vertical orientation by the engagement of the assembly tabs 370 with the assembly slots 170; attaching the side walls 200A, 200B, sequentially or simultaneously, to the base plate 100 and to the anti-tip support bar 300 by inserting each of the assembly tabs 260 of the side wall 200A, 200B into a corresponding one of the assembly notches 160 of the base plate 100 and engaging the protrusion 252 against the anti-tip support bar 300, such that the side walls 200A, 200B are supported in a substantially vertical orientation; and inserting the support beam 400 between the anti-tip support bar 300 and the first longitu-dinal wall segments 210 of the first and second side walls 200A, 200B, such that the assembly tab 460 of the support beam 400 is engaged within the assembly notch 360 formed in the upper surface of the anti-tip support bar 300. Thus, the anti-tip support bar 300 is retained in the vertical orientation between the second lateral wall segment 250 of each of the first and second side walls 200A, 200B on a first side and the support beam 400 on a second side.

Figure 3:
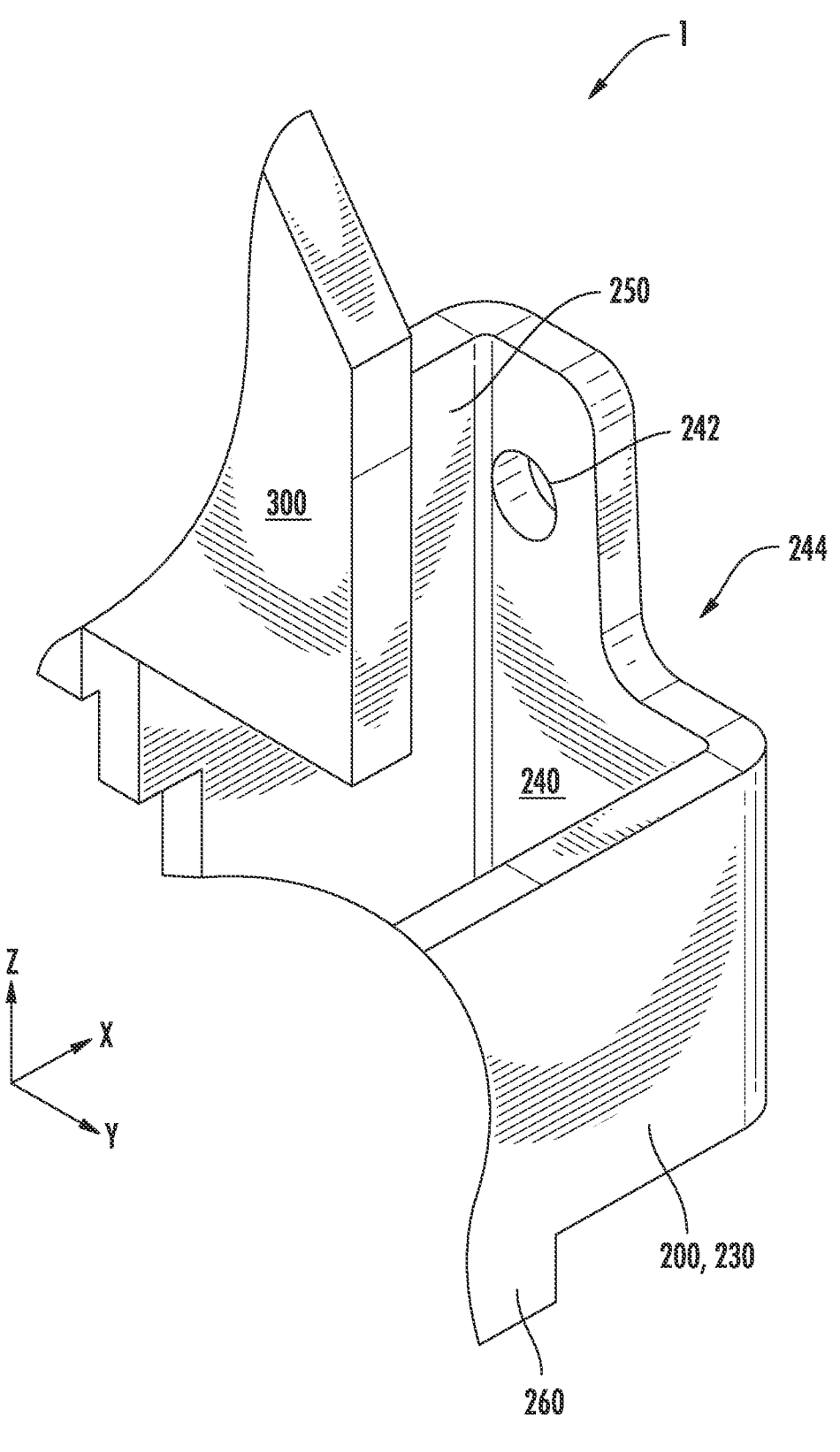
FIG. 3 is a partial detail view of the seismic base shown in FIGS. 1 and 2.

The side walls 200A, 200B are configured to provide a multitude of functions, in that the side walls 200A, 200B provide support to the telecommunications equipment rack 10 in both the longitudinal (see, e.g., Y in FIGS. 1 and 2) and lateral directions X but are also designed to accommodate the attachment of rack accessories thereto. For example, the step shape formed in the second longitudinal wall segment 240 of each of the side walls 200A, 200B, as shown in FIG. 3, advantageously aids in assembly for the covers that complete the telecommunications equipment rack 10, with the hole 242 formed in the second longitudinal wall segment 240 also being configured to allow for side accessories (e.g., spacers, spacer boxes, junction details, wire management, and other accessories, which are almost exclusively outbound of the rack) to be attached to the seismic base 1.

The anti-tip support bar 300 is a substantially planar structure that extends between the lateral wall segment 230 of each of the opposing side walls 200A, 200B. In the example embodiment shown, the anti-tip support bar 300 extends an entire distance between the lateral wall segments 230 and is connected (e.g., directly and rigidly, such as by welding) to the lateral wall segments 230 at each of the opposing ends of the anti-tip support bar 300 in the longitudinal direction Y. In some instances of the example embodiment shown in FIGS. 9 and 10, the anti-tip support bar 300 can comprise, on each longitudinal end thereof, an assembly tab that is positioned and shaped to engage within a corresponding assembly notch that is formed in an upper surface of the lateral wall segment 230 and extends in the vertical direction Z to accommodate the assembly tab within the assembly notch. In such instances of the example embodiment, the assembly notch can advantageously be formed so as to be coplanar with the assembly slots 170 of the base walls 200A, 200B are assembled with the base plate 100.

At the opposing ends of the anti-tip support bar 300, there are formed vertical sections 340 (e.g., above the broken line shown in FIGS. 4-6 and 11A-12), in which a hole 342 is formed through the thickness of this vertical section 340. Thus, between these vertical sections 340, there is a void, or region, that has a width that is substantially the same as the distance between the upright wall segments 250 of the opposing side walls 200A, 200B. As used herein, "substantially the same" includes the thickness of the upright wall segments 250, since the protrusion 252 at the end of the upright wall segment 250 of each of the side walls 200A, 200B extends within this void of the anti-tip support bar 300 for attachment of the upright wall segments 250 to the vertical sections 340 of the anti-tip support bar 300, such as by welding.

The anti-tip support bar 300 is provided to prevent the seismic base 1 from lifting during a deflection test in the longitudinal direction Y. When the anti-tip support bar 300 is assembled (e.g., via rigid attachment, such as welding) with the lateral wall segments 230 of the two side walls 200A, 200B that are positioned at opposite ends of the anti-tip support bar 300, the anti-tip support bar 300 and the lateral wall segment 230 of the side walls 200A, 200B form an I-beam structure that provides significantly enhanced strength in the lateral direction X after this I-beam structure has been rigidly attached to (e.g., by being welded directly to) the base plate 100 during formation of the seismic base 1. The bottom surface of the anti-tip support bar 300 has, extending vertically away therefrom, two discretely formed (e.g., separated from each other) assembly tabs 370 that are provided for squaring and self-fixturing of the anti-tip support bar 300 to the base plate 100 for enhanced manufacturability of the seismic base 1.

As shown in the example embodiments of FIGS. 1-6, the anti-tip support bar 300 has, at the opposing ends thereof (e.g., in the longitudinal direction Y), an angled or inclined shape within the vertical sections 340. In the example embodiments shown in FIGS. 7-12, the anti-tip support bar 300 has, at the opposing ends thereof (e.g., in the longitudinal direction Y), a stepped, or notched, region, generally designated 344, with radiused edges being formed at the "steps" or "notches" that define the stepped, or notched, region 344. The provision of the stepped region 344 can aid in attaching covers and equipment guards to the telecommunications equipment rack 10. When assembled and regardless of construction, these vertical sections 340, in conjunction with the upright wall segment 250 of each of the side walls 200A, 200B, form a channel 120 that has a generally inverted "U" shape. One of the uprights 5 referenced herein is inserted within this "U" shaped channel in such a way that the vertical section 340 and the rigid engagement of the protrusion 252 of the upright wall segment 250 of a corresponding one of the side walls 200A, 200B provides support to the upright 5 in the longitudinal direction Y. The hole 342 formed in the vertical section 340 is in the form of a U-shaped recess formed in an edge of the vertical section 340 that is directly adjacent to the protrusion 252 of the upright wall segment 250 and is aligned with the hole 242 in the second longitudinal wall segment 240 of the side wall 200A, 200B to facilitate securing side accessories, including spacers, spacer boxes, junction details, wire management, and other accessories, to the telecommunications equipment rack 10. The holes 242, 342 are provided to allow for the attachment of side accessories (e.g., spacers, spacer boxes, junction details, wire management, and other accessories, which are almost exclusively outbound of the rack) to the seismic base 1.

At a designated position along the length of the void (e.g., generally at a midpoint thereof) of the anti-tip support bar 300, the anti-tip support bar 300 has an assembly notch 360 formed therein and extending vertically (e.g., in the Z direction) into the anti-tip support bar 300. The assembly notch 360 extends from the surface of the anti-tip support bar 300 that is nearest the support beam 400, in the direction away from the support beam 400, through some or all of the thickness of the anti-tip support bar 400 (e.g., in the X direction). The support beam 400 has an assembly tab 460 formed at and extending away from an end thereof in the lateral direction X, the assembly tab 460 being configured for insertion within the assembly notch 360 of the anti-tip support bar 360 to ensure proper alignment of the support beam 400 with the anti-tip support bar 300. The support beam 400 has a structure of an at least three-sided (i.e., U-shaped) axially-extending element. As shown, the support beam 400 has a cross-section in which there are three planar sides, with two outer sides 420 connected, respectively, at proximal ends thereof to the central side 410 and extending away from a central side 410 at an angle of about 90° (e.g., +/−5°), with an open side being defined between the respective distal ends of the two outer sides 420. It is advantageous for both weight and cost for the support beam 400 to have a U-shaped cross-sectional profile. As shown in FIG. 1, the support beam 400 is positioned such that the open side is facing towards (e.g., directly against) the upper surface of the base plate 100, such that, when the support beam 400 is welded, at the distal ends of the two outer sides 420 thereof, to the base plate 100, the base plate 100 acts as the fourth side of the support beam 400, such that the support beam 400 and the base plate 100 form a four-sided prismatic structure.

The support beam 400 extends axially between a first end and a second end in the lateral direction X. The support beam 400 is positioned on the base plate 100 such that the first end is positioned adjacent to (e.g., connected to, including in direct contact with) the first longitudinal wall segment 210 of both of the two side walls 200A, 200B and the second end is positioned adjacent to (e.g., connected to, including in direct contact with) the anti-tip support bar 300. The side walls 200A, 200B and the anti-tip support bar 300 are formed such that insertion of the support beam 400 is self-aligning. At the second end, the support beam 400 has, extending axially away from the central side 410 of the support beam 400, an assembly tab 460, which has dimensions such that the assembly tab 460 can rest entirely within the assembly notch 360 of the anti-tip support bar 300. Thus, the first longitudinal wall segments 210 of the side walls 200A, 200B advantageously collectively have a width (e.g., in the longitudinal direction Y) that is substantially the same as (e.g., the same as, or +/−5%, 10%, 15%, 20%) the width of the support beam 400, as measured in the same direction. Thus, the position of the first end of the support beam 400 is precisely defined by the first longitudinal wall segments 210 of the side walls 200A, 200B and the position of the second end of the support beam 400 is precisely defined by the insertion of the assembly tab 460 of the support beam 400 within the assembly notch 360 of the anti-tip support bar 300. The assembly notch 460 of the support beam 400 advantageously has a depth (e.g., in the vertical direction Z) that is the same as, or greater than the thickness of the central side 410 of the support beam 400, such that the support beam 400 can be formed by only the steps of cutting a flat profile of the support beam 400 to form a sheet metal plate and then bending the sheet metal plate into the generally U-shaped support beam 400 shown in FIGS. 1-6.

Each telecommunications equipment rack 10 has two seismic bases 1, each of which are joined by a third component, referred to herein as a lower spanner 20, the telecommunications equipment rack 10 and the components thereof being shown in FIGS. 7-10. The support beam 400 of each of the seismic bases 1 is configured such that the lower spanner 20 can be integrated into (e.g., rigidly assembled, such as by welding) the seismic bases 1 more easily after the assembly process for the seismic bases has been completed and during assembly of the telecommunications equipment rack 10. As also shown in FIGS. 7 and 8, the telecommunications seismic rack 10 comprises, at a base (e.g., the portion that rests directly against the substructure to which the telecommunications seismic rack 10 is secured) thereof, a plurality of (e.g., two) seismic bases 1 that are linked together by the lower spanner 20 (e.g., by the lower spanner being in direct contact with, and welded to, both of the seismic bases); a plurality of (e.g., two) uprights 5, each upright 5 being rigidly and integrally attached (e.g., directly, such as by welding) at a lower end thereof to one of the two seismic bases 1; and an upper spanner 15, the uprights 5 being attached (e.g., directly, such as by welding) at an upper end of the upper spanner 15, such that the uprights 5, the lower spanner 20, and the upper spanner 15 form an enclosed generally rectangular shape.

All of the structural components (e.g., the base plate 100, the side walls 200A, 200B, the anti-tip support bar 300, and the support beam 400) are advantageously formed out of sheet metal (e.g., starting from a flat metal plate) by a stamping or other suitable cutting process to form respective flat sheet metal pieces that are then bent to form the corresponding structural component of the seismic base 1.

The respective second longitudinal wall segments 240 of the side walls 200A, 200B and the vertical sections 340 of the anti-tip bar each have a respective hole 242, 342 formed therein, through the entire thickness thereof. The hole 342 formed in each vertical section 340 of the anti-tip support bar is aligned with (e.g., substantially coaxial with) the corresponding hole 242 in the second longitudinal wall segment 240 of the side wall 200A, 200B on the same side of the seismic base 1.

Figure 4:
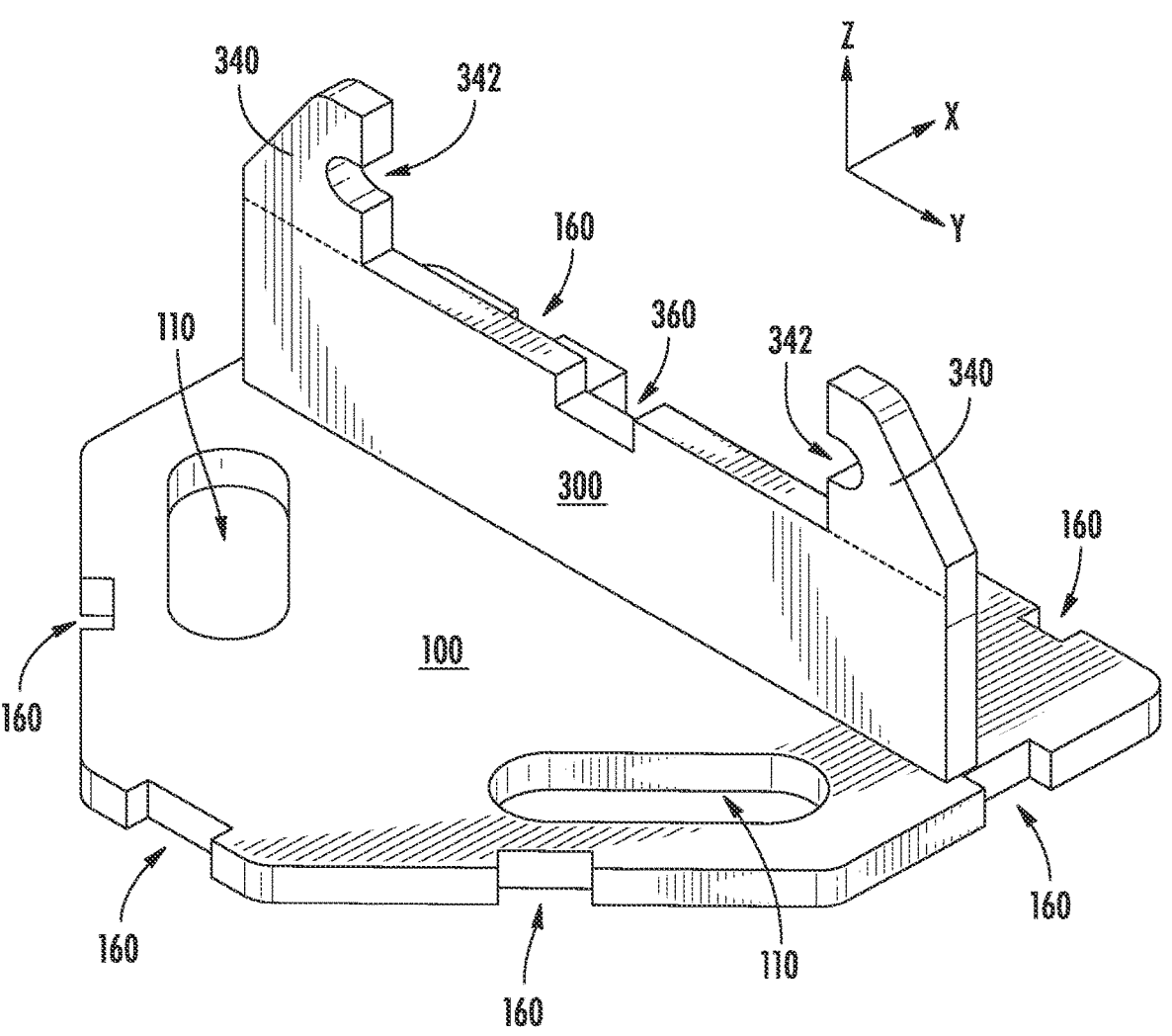
FIG. 4 is an isometric view of the seismic base shown in FIGS. 1-3 in a partially assembled state.
Figure 5:
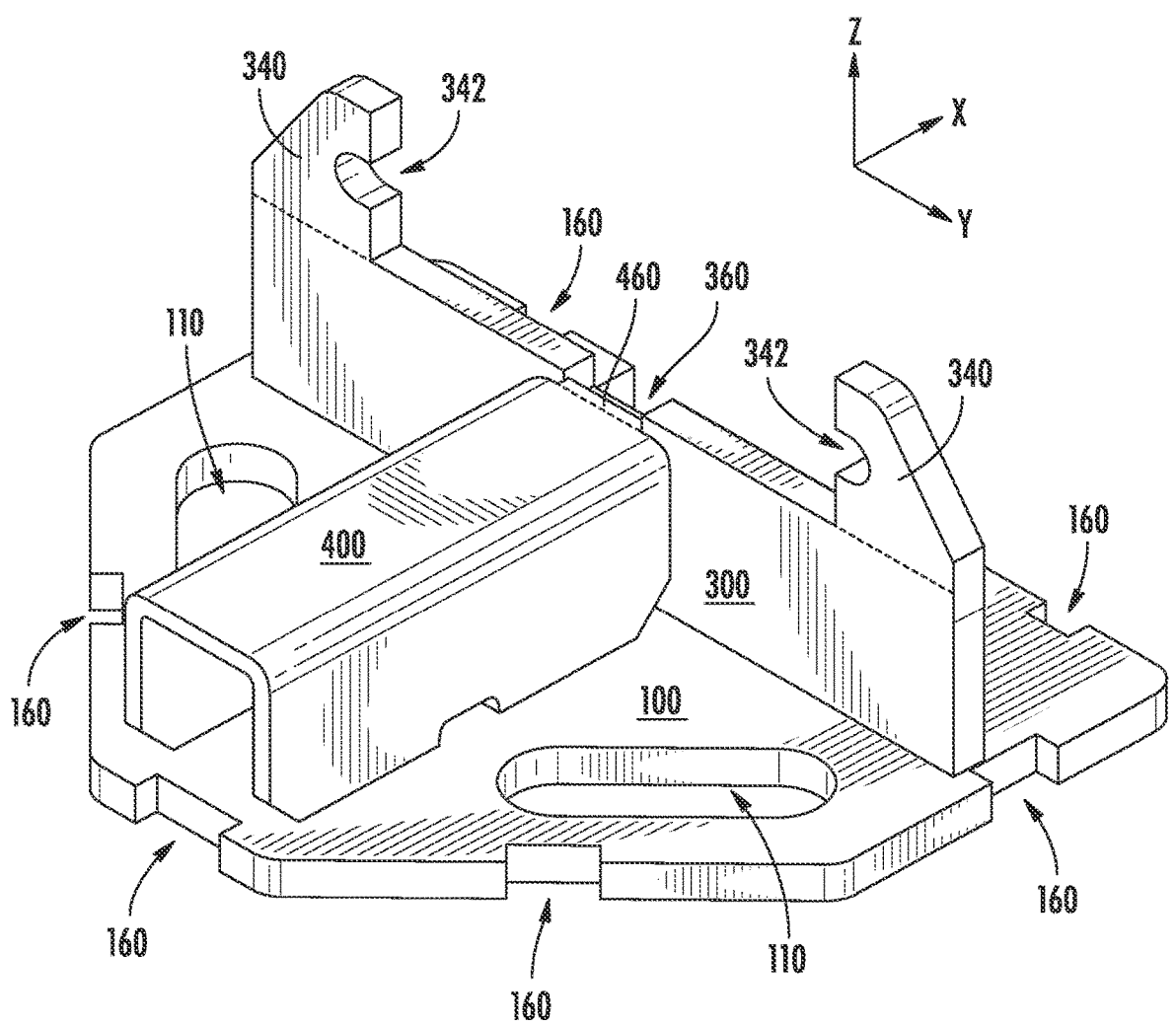
FIG. 5 is an isometric view of the seismic base shown in FIG. 4 in a further partially assembled state.

Assembly steps for making the seismic base 1 are shown in FIGS. 4-6. In FIG. 4, the base plate 100 is provided and the anti-tip support bar 300 is positioned such that the assembly tabs 370 on the bottom surface of the anti-tip support bar 300 are inserted within a corresponding one of the assembly slots 170 formed in the base plate 100. The base plate 100 has, as shown in FIG. 1, a U-shaped cut-out region, into which the upright 5 of the telecommunications equipment rack 10 is to be rigidly inserted. The anti-tip support bar 300 can be positioned so that a surface thereof is coplanar with the middle section of the U-shaped cut-out region formed in the base plate 100, thereby forming a portion of the channel 120. As such, when the anti-tip support bar 300 and the base plate 100 are assembled together, a planar surface of the anti-tip support bar 300 and the middle section of the U-shaped cut-out region are substantially continuous and uninterrupted. In the example embodiment shown in FIGS. 11A-12, the anti-tip support bar 300 is positioned so that a surface thereof is recessed (e.g., spaced apart) from the middle section of the U-shaped cut-out region formed in the base plate 100, thereby forming a portion of the channel 120. As such, when the anti-tip support bar 300 and the base plate 100 are assembled together, a planar surface of the anti-tip support bar 300 and the middle section of the U-shaped cut-out region have a stepped, non-contiguous, arrangement, such that the upright 5 is positioned on top of the base plate 100 when the upright 5 is arranged adjacent to the planar surface of the anti-tip support bar 300 during formation/assembly of the telecommunications equipment rack 10.

As is also shown in FIG. 4, the anti-tip support bar 300 extends substantially vertically away from the base plate 100, substantially perpendicular to the base plate 100 and the generally horizontally-extending plane defined by the extension of the base plate 100 in the longitudinal direction Y and lateral direction X. Thus, stated somewhat differently, the assembly step shown in FIG. 4 comprises clamping the base plate 100 to a universal fixture and then inserting the assembly tabs 370 on the anti-tip support bar 300 into the corresponding assembly slots 170 formed in the base plate 100. The base plate 100 and the anti-tip support bar 300 can then be welded together (e.g., manually or robotically, such as in an automated manner). Optionally, the anti-tip support bar and the base plate are clamped together during the welding process. In some embodiments, the anti-tip support bar 300 is not welded or otherwise fixedly attached to the base plate 100 before proceeding to a further assembly step, such as the arrangement of the side walls 200A, 200B or the support beam 400 on the base plate 100.

In FIG. 5, a further assembly step is shown, in which the support beam 400 is placed with the distal ends of the outer sides of the support beam 400 against (e.g., in direct contact with) the upper surface (e.g., relative to the vertical direction) of the base plate 100 and the assembly tab 460 of the support beam 400 inserted into the assembly notch 360 formed in the upper surface of the anti-tip support bar 300. The second end of the support beam 400 is also advantageously adjacent to (e.g., in direct contact with) the anti-tip support bar 300 for being welded thereto in a subsequent step. Thus, the support beam 400 can preliminarily be positioned relative to the base plate 100 and the anti-tip support bar 300 by the engagement of the assembly tab 460 of the support beam 400 with the assembly notch 360 of the anti-tip support bar 300. Once in proper position with respect to the base plate 400, the support beam 400 can be welded together (e.g. manually or robotically, such as in an automated manner) in this position. Optionally, the support beam 400 can be clamped to the base plate 100 during the welding process. In some embodiments, the support beam 400 is not welded or otherwise fixedly attached to the base plate 100 before proceeding to a further assembly step, such as the arrangement of the side walls 200A, 200B on the base plate 100. In some embodiments, the support beam 400 may be provided on the base plate 100 after the side walls 200A, 200B are assembled onto the base plate 100. It is further noted that, due to the engagement of the assembly tab 460 within the assembly notch 460, it is generally advantageous to assemble the support beam 400 onto the base plate 100 after the anti-tip support bar 300 is assembled with the base plate 100.

In FIG. 6, another assembly step is shown, in which the side walls 200A, 200B are positioned about the perimeter of the base plate 100. It is noted that the attachment of the side walls 200A, 200B to the base plate 100 can, in some embodiments, be second and third steps, respectively, occurring after attachment of the anti-tip support bar 300 to the base plate 100 and before attachment of the support beam 400 to the base plate 100. Thus, in a method of assembly, a first step comprises positioning the anti-tip support bar 300 on the base plate 100, such that engagement features (e.g., assembly tabs 370) of the anti-tip support bar 300 are engaged with (e.g., inserted within) corresponding engagement features (e.g., slots 170) of the base plate 100. A second step of the method comprises attaching a first one of the side walls 200, 200B to the base plate 100, such as by the engagement features (e.g., assembly tabs 260) of the first one of the side walls 200A, 200B being engaged with (e.g., inserted within) corresponding engagement features (e.g., assembly notches 160) of the base plate 100. The first one of the side walls 200A, 200B can be either of the side walls 200A, 200B, without limitation. A third step of the method comprises attaching a second one of the side walls 200, 200B to the base plate 100, such as by the engagement features (e.g., assembly tabs 260) of the second one of the side walls 200A, 200B being engaged with (e.g., inserted within) corresponding engagement features (e.g., assembly notches 160) of the base plate 100. The second one of the side walls 200A, 200B is whichever of the side walls 200A, 200B that is not the first one of the side walls 200A, 200B. The side walls 200A, 200B can be positioned to engage with the base plate 100 in unison with each other or sequentially. When the side walls 200A, 200B are assembled onto the base plate 100 in unison (e.g., simultaneously), the second and third steps can be combined to form a single step. For each of the side walls 200A, 200B, the assembly tabs 260 of such side wall 200A, 200B are inserted within a corresponding one of the assembly notches 160 formed about (e.g., in, extending inwardly from) the perimeter of the base plate 100 and, simultaneously, the protrusion of the upright wall segment 250 of each side wall 200A, 200B is positioned on top of the upper surface of the anti-tip support bar 300, within the void or region thereof, defined between the vertical sections 340 of the anti-tip support bar 300. A fourth step of the method comprises positioning the support beam 400 on the base plate 100, in a position in which movement of the support beam 400 is limited in the lateral and longitudinal directions X, Y by engagement with (e.g., resting in close proximity to) the side walls 200A, 200B and the anti-tip support bar 300. Specifically, the support beam 400 is positioned such that the first longitudinal wall segment 210 of each of the first and second side walls 200A, 200B is positioned adjacent to (e.g., in direct contact with) the first end of the support beam 400, preventing substantially any movement of the support beam 400 in the longitudinal direction Y and/or the lateral direction X. During the fourth step, the assembly tab 460 of the support beam 400 is at least partially inserted within the assembly notch 360 of the anti-tip support bar 300.

With the side walls 200A, 200B in position, a U-shaped channel 120 for insertion of an upright 5 of the telecommunications equipment rack 10 therein is provided, the U-shaped channel 120 being defined by the cut-out region in the base plate 100, the anti-tip support bar 300, and the upright wall segment 250 of the side walls 200A, 200B, respectively. The assembly tabs 260 on both side walls 200A, 200B are thus each positioned in a corresponding one of the assembly notches 160 formed in the base plate 100 and are welded together (e.g. manually or robotically, in an automated manner) to the greatest extent possible.

The side walls 200A, 200B, the anti-tip support bar 300, and the support beam 400 can thus be attached to the base plate 100 in any desired order. It can be advantageous, in some instances, to assemble each of the side walls 200A, 200B, the anti-tip support bar 300, and the support beam 400 on the base plate 100 without welding each component before a subsequent component is assembled, since this allows for each of the components to "float" or move with respect to each other to allow for relative movement between the components that allows engagement of the various assembly tabs 260, 370, 460 within the various assembly notches 160, 360 or slots 170 that may be more difficult or impossible when previously assembled components are rigidly interconnected to prevent relative movement therebetween. However, the use of automated (e.g., robotic) welding can be significantly limited in such an example embodiment for assembly of the seismic base 1, thereby requiring significantly more manual welding operations to be performed than if the components are welded together and to the base plate 100 in a sequential manner, in which a robotic welding head has fewer obstructions to maneuver around and/or to be blocked by.

In a further, optional, step, after the welding together of the base plate 100 to the side walls 200A, 200B, the semi-finished seismic base 1 is removed from the fixture and a manual (e.g., human-operated) welding operation is performed for welds that the robotic weld head cannot access.

Manufacturability, efficiency, and automation were key goals in the design of the seismic base 1 disclosed herein. By utilizing a multi-functional fixture in conjunction with a robotic welder, it may be possible to perform the steps shown in FIGS. 4-6 substantially simultaneously (e.g., not sequentially) to further enhance efficiency.

Figure 11A:
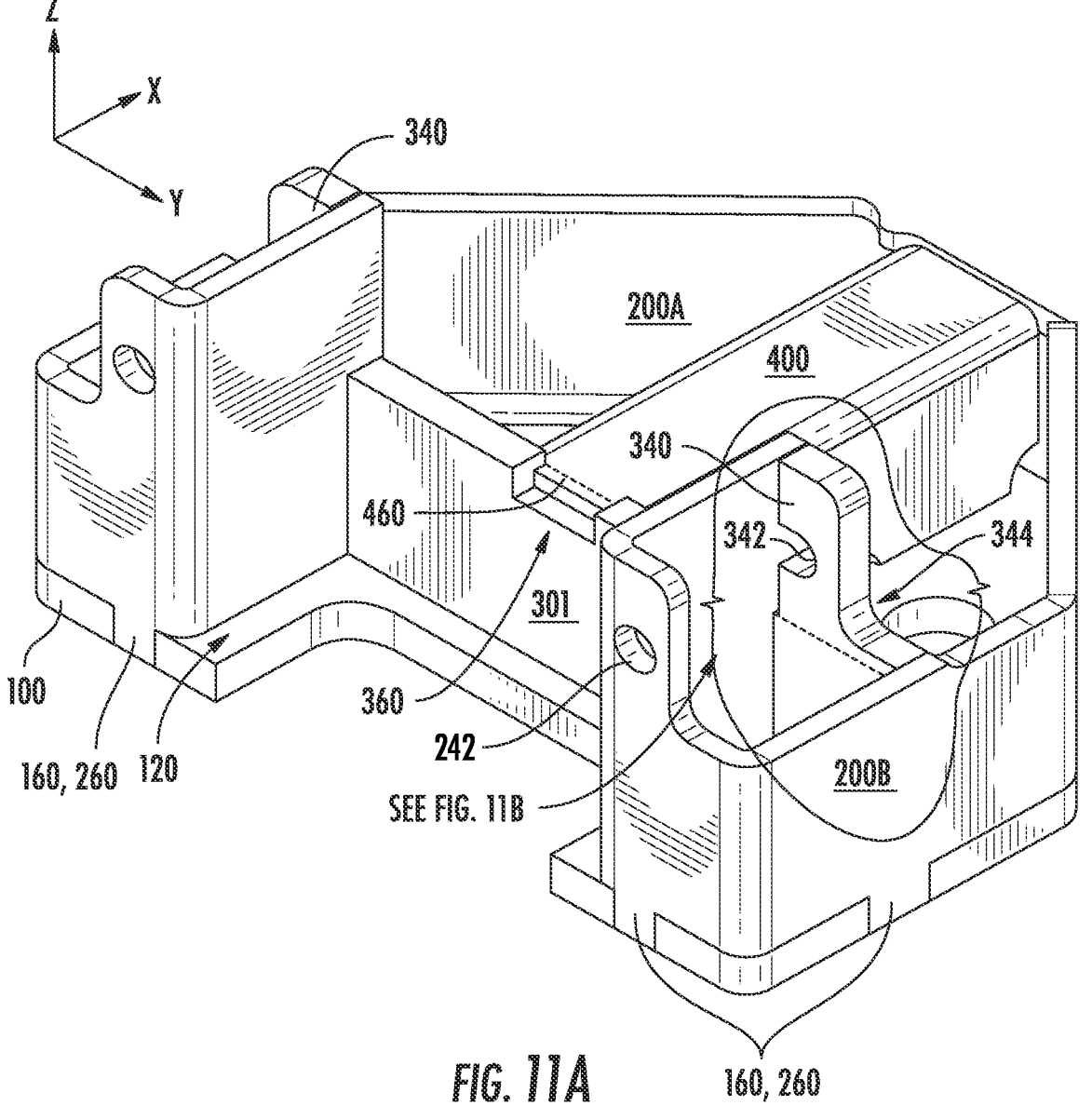
FIG. 11A is an isometric view of another example embodiment of a seismic base disclosed herein.
Figure 11B:
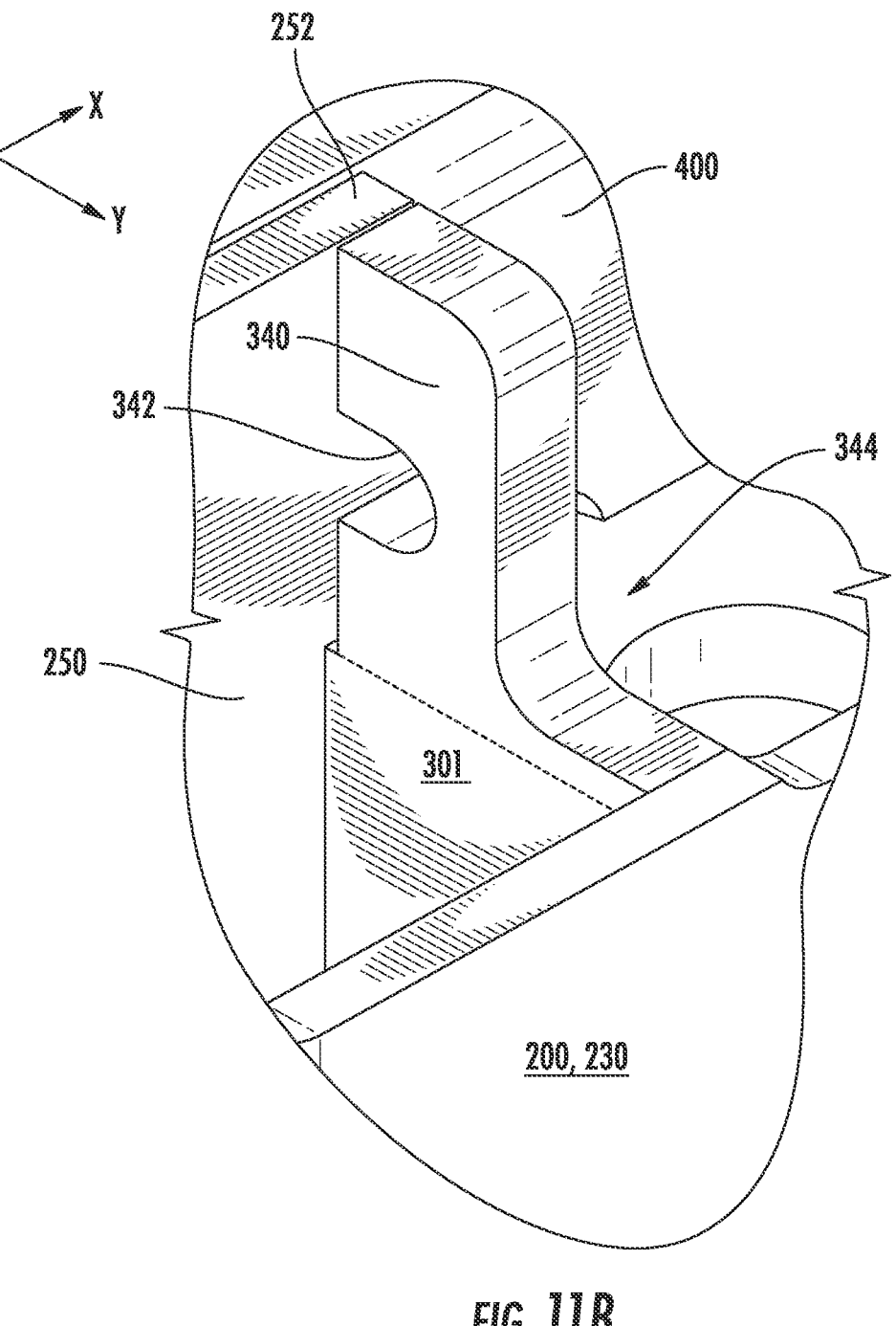
FIG. 11B is an enlarged detailed view of a portion of the seismic base shown in FIG. 11A.
Figure 12:
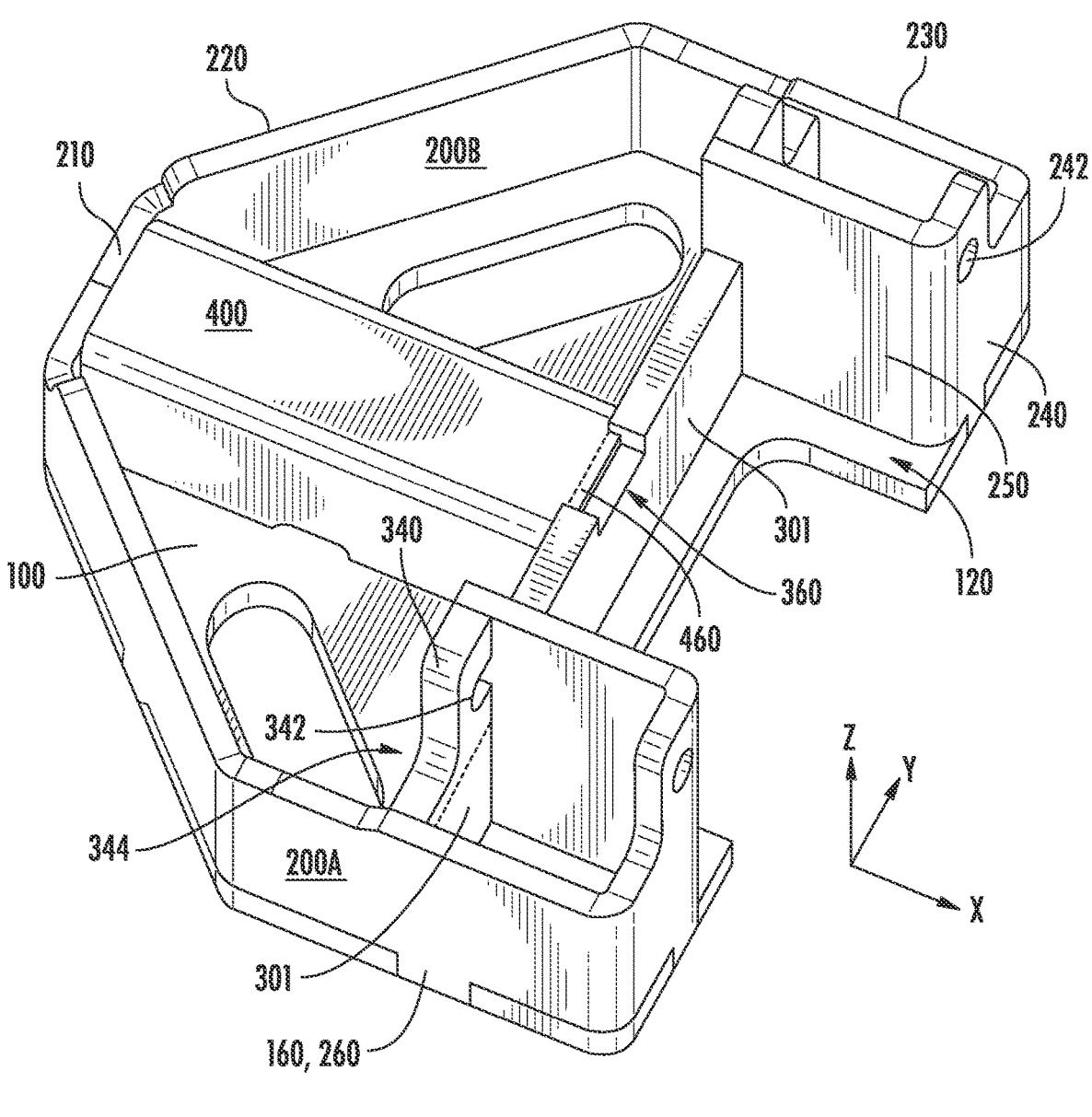
FIG. 12 is a perspective view of the seismic base shown in FIGS. 11A and 11B.

A particularly advantageous aspect of the design of the side walls 200A, 200B disclosed herein is that the upright wall segment 250 thereof, when welded to the base plate 100, forms a portion of the channel 120 for the uprights 5 to be inserted therein and to either extend all the way to the substructure (e.g., to the surface on which the base plate 100 is supported directly, such as a floor), as shown in the example embodiment of FIGS. 1-6, or to rest on the upper surface of the base plate 100, as shown in the example embodiment of FIGS. 11A-12. Such a design in which the uprights 5 can be embedded or integrated (e.g., rigidly connected) into the seismic base 1 during formation of the telecommunications equipment rack 10 is advantageous, at least for the reason that the strength of the telecommunications equipment rack 10 (e.g., the resistance to deformation and deflection) is greatly increased by such a manufacturing technique, so that a telecommunications equipment rack 10 having the seismic bases 1 disclosed herein can achieve a seismic qualification weight of 1,000 lbs. per the GR-63-

CORE, Zone 4 criteria, while also meeting all appropriate spatial requirements noted in the same document.

The seismic bases 1 disclosed herein are designed such that any telecommunications equipment rack 10 with this such seismic bases 1 is compatible with other telecommunications equipment racks in the Newton Instrument Company® product line. Additionally, the seismic bases 1 disclosed herein are compatible with both the current Newton Instrument Company® Symrack and SuperSymrack in terms of form and fit. The seismic bases 1 disclosed herein are, unlike a conventional sheet steel rack base, symmetric along a plane defined in the lateral direction X and the vertical direction Z passing through the midpoint (e.g., in the longitudinal direction) of the seismic base 1. By centering, with respect to this plane, the uprights 5, to which the telecommunications infrastructure equipment is attached, in the middle of the seismic base 1 provides an "I" shaped rack rather than the "L" shape prevalent in known conventional seismic-rated telecommunications equipment racks. Such a symmetric design provides a more equal response in both the lateral direction X and the vertical direction Z from a deflection perspective when the rack is undergoing a seismic test in the longitudinal direction Y.

Figure 13:
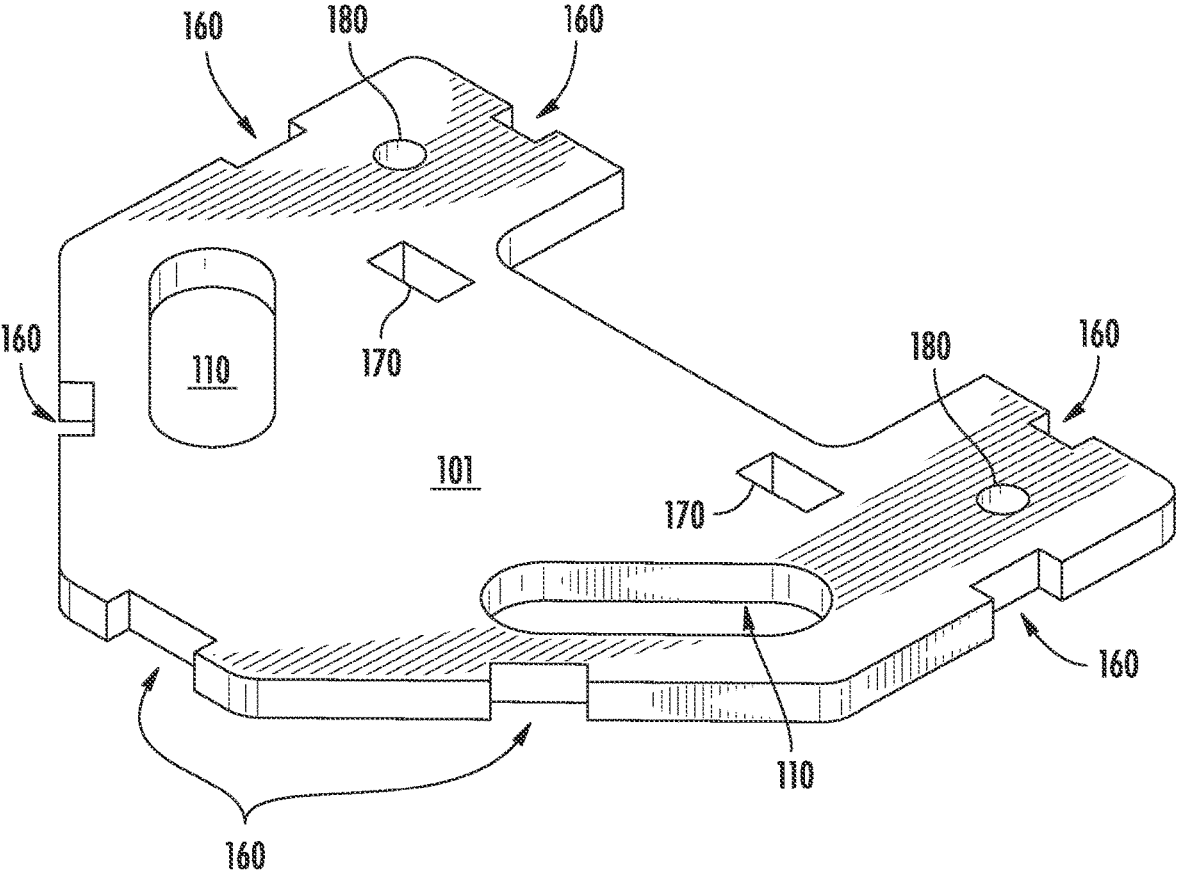
FIG. 13 is a perspective view of another embodiment of a base plate suitable for use in any of the seismic bases disclosed herein.

Another example embodiment of a base plate 101 is shown in FIG. 13. The base plate 101 is designed to be used in any of the seismic bases 1 disclosed herein. The base plate 101 is generally similar to the base plate 100 that is shown, for example, in FIG. 1. Thus, the base plate 101 has a plurality of assembly notches, generally designated 160, which are configured for engagement with the respective assembly tabs 260 of the side walls 200A, 200B. The base plate 101 also comprises at least one (e.g., a plurality of) assembly slots, generally designated 170, that are formed so as to extend from a bottom surface, or edge, of the anti-tip support bar 300 and into a corresponding one of the assembly slots 170 of the anti-tip support bar 300. The base plate 101 also has at least one (e.g., a plurality of) fastener holes, generally designated 110, in which fasteners can be positioned for rigidly attaching the seismic base 1 to a substructure (e.g., a floor).

It is noted that it is a general requirement, when installing a seismically-rated telecommunications equipment rack 10, for the telecommunications equipment rack 10 to be installed level and square. The conventional way that this was achieved was through the use of shims. These shims are conventionally shaped to fit around the anchor bolt (e.g., the fastener that passes through one of the fastener holes 110). During installation of the telecommunications equipment rack 10, a sufficient quantity of such shims is added in each corner until the telecommunications equipment rack 10 is level and square, then each seismic base 1 is secured to the respective anchor bolts. The base plate 101 is operable and is designed such that a telecommunications equipment rack 10 can be installed without the use of such shims.

Thus, so that the telecommunications equipment rack 10 can be installed level and square, each of the base plates 101 has one or more of (e.g., a plurality of) leveling holes 180. The leveling holes 180 are threaded and configured to receive therein a set screw that will, when sufficiently screwed into the leveling hole 180 with which it is associated, protrude out of a bottom surface of the base plate 101. Thus, the leveling holes 180 extend through an entire thickness of the base plate 101 in the Z-direction. The progressive threaded engagement of the set screw within the leveling hole 180 will cause the end of the set screw to protrude out of the leveling holes 180, beyond the X-Y plane defined by the bottom surface of the base plate 101, the protrusion of the set screw being proportional to the threaded engagement of the set screw within the leveling hole 180 (e.g., screwing the set screw into the leveling hole 180 causes the set screw to axially move, relative to the leveling hole 180, by a corresponding distance).

Thus, by threadably engaging (e.g., screwing) each set screw into/out of a corresponding one of the leveling holes 180, a gap between the bottom surface of the base plate and support surface can be controlled at the leveling hole 180, which in turn causes a pivoting movement of the seismic base 1 in the Y-Z plane, about the X-axis. The leveling holes 180 are advantageously formed mirrored about a midplane (see, e.g., MP, FIG. 2) of the base plate 101. Similarly, the telecommunications equipment rack 10 can be leveled in the X-Z plane, by pivoting about the Y-axis, by engagement of the set screws in one or both of the leveling holes 180 on the same seismic base 1. When the seismic base 1 is secured to the anchor bolt, the compressive force exerted on the set screw between the support surface and the base plate 101 acts to resist rotation of the set screws within the corresponding leveling holes 180.

In some embodiments, an adhesive or other suitable material may be used (e.g., by application onto the threads of the set screw before engagement into the leveling hole 180 occurs) to secure the set screws within each of the leveling holes 180 to further resist rotation of the set screw within the corresponding leveling hole 180. Thus, by threaded engagement of a set screw into each of the leveling holes 180, the telecommunications equipment rack 10 can be installed level and square on an uneven support surface (e.g., one that is not level and/or square) without the use of conventional shims. In the example embodiment, the leveling hole is drilled and tapped to have a ½-⅓ thread pattern. The leveling holes 180 are advantageously formed on a same side of the base plate 101 with respect to a midplane through the base plate 101 in the Y-Z plane, particularly within the region of the base plate 101 on the opposite side of the anti-tip support bar 300 from the support beam 400.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

The invention claimed is:

1. A base structure for an equipment rack, the base structure comprising:
   a base plate;
   a first side wall attached to the base plate;
   a second side wall attached to the base plate, wherein the second side wall is positioned behind the first side wall in a longitudinal direction;
   an anti-tip support bar extending between the first and second side walls in the longitudinal direction; and
   a support beam extending in a lateral direction, between the anti-tip support bar and a first lateral wall of the first and second side walls, respectively;
   wherein the base structure is configured to resist translatory and/or pivoting movements in or about, respectively, the longitudinal direction and the lateral direction.

2. The base structure of claim 1, wherein:
   the first and second side walls are substantially identical mirror images of each other; and/or the anti-tip support bar and the first and second side walls, when assembled together, form a channel configured to receive therein an upright of the equipment rack.

3. The base structure of claim 2, wherein the channel has a U-shaped cross-sectional profile and extends coplanar with:

a bottom surface of the base plate; or a top surface of the base plate.

4. The base structure of claim 3, wherein the U-shaped cross-sectional profile is formed by an upright wall segment of each of the first and second side walls and the anti-tip support bar.

5. The base structure of claim 4, wherein the anti-tip support bar is welded, at opposing ends thereof in the longitudinal direction, to the first side wall and to the second side wall, respectively.

6. The base structure of claim 5, wherein the support beam is configured to engage with the anti-tip support bar to resist movement of the upright within the channel in the lateral direction.

7. The base structure of claim 1, wherein:

the base plate comprises a plurality of assembly notches and/or assembly slots formed therein in a thickness direction of the base plate;

the first and second side walls each comprise a plurality of assembly tabs positioned to align with the plurality of the assembly notches of the base plate for assembly of the first and second side walls to the base plate;

the anti-tip support bar comprises an assembly notch formed on an upper surface thereof and a plurality of assembly tabs formed on a bottom surface thereof; and the support beam comprises an assembly tab configured for insertion within the assembly notch of the anti-tip support bar.

8. The base structure of claim 7, wherein the assembly tabs and assembly notches and assembly slots are formed such that the base structure can be assembled without the use of a jig to hold the base plate, the first and second side walls, the anti-tip support bar, and the support beam together prior to a welding process being performed to form the base structure.

9. The base structure of claim 1, wherein:

the base plate is welded to each of the first and second side walls, the anti-tip support bar, and the support beam;

the anti-tip support bar is welded to the first and second side walls and the support beam; and the first and second side walls are welded to the support beam.

* * * * *